July 21, 1970 R. SHAHBENDER 3,521,198

ELECTRONICALLY CONTROLLED DELAY LINE

Filed Aug. 9, 1965

INVENTOR.
RABAH SHAHBENDER
BY
Edward J. Norton
ATTORNEY

United States Patent Office 3,521,198
Patented July 21, 1970

3,521,198

ELECTRONICALLY CONTROLLED DELAY LINE

Rabah Shahbender, Princeton, N.J., assignor to RCA Corporation, a corporation of Delaware Filed Aug. 9, 1965, Ser. No. 478,346
Int. Cl. H03h 7/36
U.S. Cl. 333—29 5 Claims

ABSTRACT OF THE DISCLOSURE

A variable delay line including a ferrite material having a conductor embedded therein. A delay control signal is passed through the conductor. A signal to be delayed is also applied to the conductor. The delayed signal and the control signal are fed to an output transformer in a manner to maintain the impedance match of the delay line and of the output means coupled to the transformer as the delay is varied. Alternatively, an auxiliary conductor is also embedded in the ferrite material and the delay control signal is caused to flow therethru, the signal being applied to the first-mentioned conductor.

This invention relates to a delay line whose delay may be varied by variations of a current and without moving parts or circuit contacts.

Variable delay lines find utility in various electronic equipments. In general a variable delay line has utility in providing a predetermined delay of a signal applied to its input. The delay line is used to equalize delays in parallel circuits carrying the same or cooperating signals for example, or for measuring elapsed time. So that the delay line shall not distort the applied signal to be delayed, it should delay each frequency component of the applied signal equally.

Difficulty can be experienced in matching the impedance of a variable delay line to that of a circuit to which the delay line is coupled. For example, the delay of a delay line including inductance and capacity is proportional to the square root of the products of the inductance and capacity, while the characteristic impedance of the delay line is equal to the square root of its inductance divided by its capacity. Therefore, when the delay of the delay line is varied by varying either its inductance or its capacity, the characteristic impedance of the delay line also varies, whereby the delay line may be matched in impedance to the circuits to which it is coupled at only one value of delay of the delay line. At other adjustments of the delay line, the impedance match may no longer exist.

It is an object of this invention to provide an improved delay line.

It is a further object of this invention to provide a delay line whose delay may be continuously varied without moving parts and without making or breaking circuit contacts.

It is another object of this invention to provide automatically matched coupling between a variable delay line and the circuit to which it is coupled.

Figure 1:
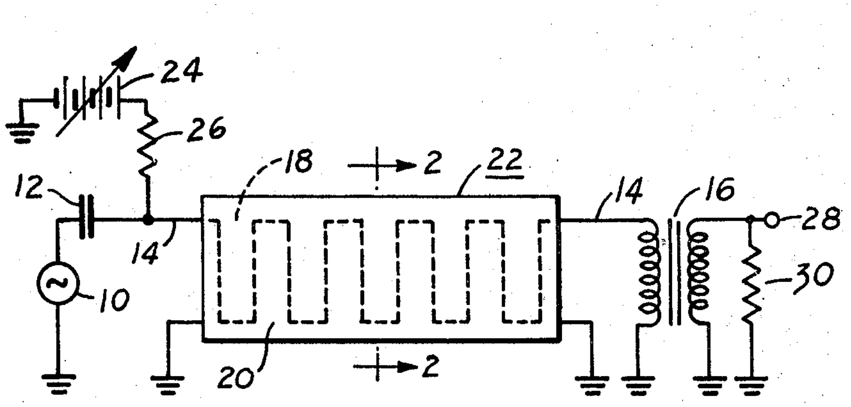
Figure 2:
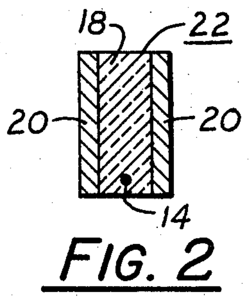
Figure 3:
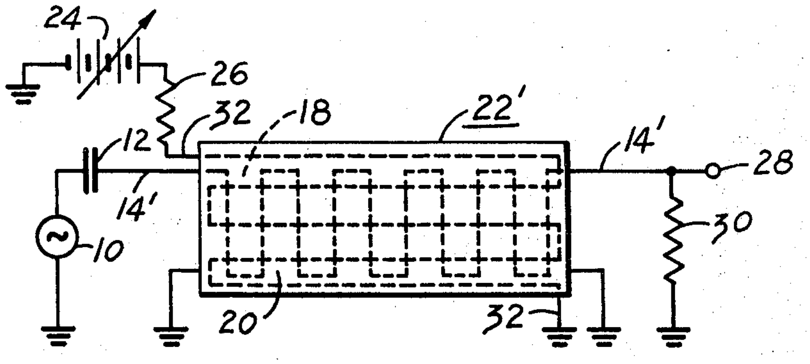

The novel features of this invention both as to its organization and method of operation as well as additional objects and advantages thereof will be more readily understood from the following description when read in conjunction with the accompanying drawing in which FIG. 1 is a diagrammatic representation of a circuit including an embodiment of the variable delay line of this invention in which means are provided automatically to match the impedance of the delay line to an output connected thereto as the delay is varied, FIG. 2 is a cross section of the delay line of FIG. 1 on line 2—2 thereof, and FIG. 3 is a diagrammatic representation of a circuit including another embodiment of the variable delay line of this invention.

Referring first to FIG. 1, a signal to be delayed is applied by a signal source 10, one terminal of which is grounded through a blocking capacitor 12 and through a conductor 14 to one terminal of the primary winding of an iron core transformer 16, the other terminal of which is grounded. This conductor 14 is embedded for the greater part of its length in an extended manner in ferrite material 18 (see FIG. 2). Suitable ferrite material may be manganese-magnesium-ferrites with substitutions such as zinc or lithium ferrites. Although the conductor 14 in FIG. 1 is shown as extending along a square wave path through the ferrite material 18, the conductor may extend in any other configuration or path through the ferrite material 18 in such a manner that the magnetic field of the conductor 14 penetrates into the ferrite material 18 surrounding the conductor. Ground plates 20 of conductive material are provided in contact with the ferrite material 18 and on opposite sides thereof to provide distributed capacity for the delay line. Each of the ground plates 20 may be connected to ground as indicated. The ferrite material 18, the ground plates 20 and the portion of the conductor 14 that is embedded in the ferrite material 18 together comprise the delay line 22. An adjustable source of delay control current 24 is shown as connected between ground and a terminal of a current limiting resistor 26, the other terminal of the resistor 26 being connected to the conductor 14 between the capacitor 12 and the delay line 22. The secondary winding of the transformer 16 is connected between an output terminal 28 and ground, and an impedance matching resistor 30 is connected in parallel with the secondary winding of the transformer 16. The resistor 30 has a value such that the impedance seen by the delay line 22 is equal to the characteristic impedance of the delay line when adjusted to provide its maximum delay.

In the operation of the circuit of FIG. 1, a signal provided by the source 10 arrives at the output terminal 28 after a delay which is proportional to the square root of the product of the inductance and capacity of the delay line 22. An increase in current from the source 24 increases the magnetic field applied by the conductor 14 to the ferrite material, whereby the inductance and therefore the delay provided by the delay line 22 is decreased. However, since the characteristic impedance of the delay line 22 depends upon the square root of the ratio of the inductance of the delay line and of its capacity, decreasing the delay of the delay line 22 also decreases its characteristic impedance, whereby the delay line is no longer properly matched to its output circuit. To provide proper matching of the load to the delay line 22, the impedance of the load as seen by the delay line 22 must vary as the delay is varied. In the circuit of FIG. 1, this is automatically accomplished by operation of the iron core transformer 16. The control current flowing through the conductor 14 also flows through the primary winding of the output transformer 16. As the current flowing from the source 24 is increased to decrease the delay of the delay line 22, the current flow in the primary winding in the transformer 16 also is increased, whereby the magnetization of the core of the transformer 16 is increased. Therefore, the coupling between the primary and the secondary winding of the transformer 16 is reduced whereby the impedance of the resistor 30, as seen by the delay line 22, is decreased and the matching of the delay line to its load is automatically accomplished.

In FIGS. 1, 2 and 3, the same elements have been given the same reference characters. The signal source 10 of FIG. 3 applies a signal between ground and one terminal of a blocking capacitor 12. The other terminal of the capacitor 12 is connected through a conductor 14' to an output terminal 28. The greater portion of the conductor 14' is embedded in and takes an extended path through the ferrite material 18 which comprises part of the delay line 22'. The delay line 22' also includes a second conductor 32, the greater portion of which is also embedded in the ferrite material 18, but is insulated from the conductor 14'. As shown in FIG. 3, the paths of the conductors 14' and 32 in the ferrite material 18 may resemble square waves having orthogonally related axes. However, any path of either or both conductors that causes the magnetic field to penetrate substantially the same volume of ferrite materials may be used as long as the two conductors 14' and 32 are insulated from each other. For example, the two conductors 14' and 32 may take identical paths in parallel planes or the two conductors 14' and 32 may be interwoven in the same plane. The delay line 22' is completed by two grounded ground plates 20 (only one of which is shown in FIG. 3) in contact with opposite sides of the ferrite material 18. Delay controlling current is caused to flow through the conductor 32 and through the current limiting resistor 26 by the variable current source 24. An impedance matching resistor 30 is connected between the terminal 28 and ground. In the circuit of FIG. 3, no provision is made to automatically provide the matching of the load to the delay line 22', therefore in the circuit of FIG. 3, the resistance of the resistor 30 is chosen to have a value in the range of characteristic impedances of the delay line 22' as its delay is varied. The circuit of FIG. 3 exhibits the advantage of separate signal voltage and control current paths whereby no interference of one on the other takes place.

Although only two embodiments of a controllable delay line have been described, variations are possible within the spirit of the present invention. For example, only one ground plate may be necessary to provide the required distributed capacity for the delay line. The single plate may comprise a cylinder surrounding the ferrite and having a slot therein parallel to the axis of the cylinder. Or the additional wire 32 shown in FIG. 3 may be connected to a third winding on an output transformer such as 16 of FIG. 1, whereby the control current and the signal voltage are kept separate and yet the impedance of the output is matched to the delay lines automatically. Hence it will be understood that the foregoing description is to be considered as illustrative and not in a limiting sense.

What is claimed is:

1. A variable delay line, comprising:

a body of ferrite material, a conductor embedded in said ferrite material, said conductor being fixed in said ferrite material to become an integral part thereof, a conductive grounding plate in contact with said ferrite material to provide distributed capacitance for said delay line, means to apply a signal to be delayed to one end of said conductor, and means to simultaneously pass with said signal a controllable bias current through said conductor to vary the delay provided by said delay line.

2. A delay line comprising a body of ferrite material, a first conductor embedded in said ferrite material, a second conductor insulated from said first conductor and also embedded in said ferrite material, a conductive grounding plate in contact with said ferrite material, means to apply a signal to be delayed to one end of said first conductor, and means to pass a controllable current through said second conductor to vary the delay presented by said delay line according thereto.

3. In combination, a variable delay line presenting an output characteristic impedance that varies as the delay thereof is varied and a load on said delay line, the impedance of said load varying to match the impedance of said delay line, said delay line comprising a body of ferrite material and a conductor embedded therein, means to apply a signal to be delayed to one end of said conductor, means to apply a variable magnetic field to said ferrite material thereby to vary the delay presented by said delay line and also thereby varying the characteristic impedance of said delay line, said load comprising an iron core transformer having a primary and a secondary winding, a resistor connected across said secondary winding, said primary winding being connected in series with said conductor to cause a further magnetic field to be applied to said iron core which is in phase with the variation of said first-mentioned magnetic field applied to said ferrite material, whereby said delay line remains matched to said load as said delay is varied.

4. A combination of a variable delay line that presents an output characteristic impedance that varies as the delay thereof is varied and a load on said delay line, the impedance of said load varying to match the impedance of said delay line, said delay line comprising, a body of ferrite material having a conductor embedded therein, said conductor having terminals, a conductive grounding plate in contact with said ferrite material, means to apply a signal to be delayed to the terminals of said conductor, means to pass a variable current through said conductor to thereby vary the delay of said delay line, an iron core transformer forming part of said load and having a primary winding and a secondary winding, said primary winding being connected in series with said conductor, and a resistor connected across said secondary winding, whereby variation in current passed through said conductor also varies the coupling of said primary and secondary windings and thereby varies the output impedance that said delay line sees to thereby maintain a match between the characteristic impedance of said delay line and of said load thereon.

5. A variable delay line comprising a body of ferrite material between and in contact with a pair of conductors, said ferrite material filling the space between said conductors, a third conductor embedded in said ferrite material between said pair of conductors, means to apply a signal to be delayed to one end of said third conductor, and means to pass a controllable bias current through said third conductor to vary the delay provided by said delay line.

References Cited

UNITED STATES PATENTS

| | | | |
|---|---|---|---|
| 2,911,598 | 11/1959 | Clemenson | 333—29 |
| 3,289,110 | 11/1966 | Weiss | 333—24.1 |
| 3,277,401 | 10/1966 | Stern | 333—24.1 |
| 3,290,622 | 12/1966 | Hair | 333—24.1 |
| 3,289,115 | 11/1966 | Carr | 333—24.1 |
| 3,012,203 | 12/1961 | Tien | 330—5 |
| 2,949,585 | 8/1960 | Katz | 333—29 |
| 2,650,350 | 8/1953 | Heath | 332—29 |
| 2,619,537 | 11/1952 | Kihn | 333—31 |
| 3,274,521 | 9/1966 | Nourse | 333—24.1 |
| 3,317,863 | 5/1967 | Ngo | 333—24.2 |

HERMAN KARL SAALBACH, Primary Examiner

C. BARAFF, Assistant Examiner

U.S. Cl. X.R.

333—24.1, 84